United States Patent
Nakahama et al.

(10) Patent No.: US 8,865,505 B2
(45) Date of Patent: Oct. 21, 2014

(54) DIAPHRAGM SHEET, METHOD FOR MANUFACTURING SOLAR CELL MODULE USING DIAPHRAGM SHEET, AND LAMINATION METHOD USING LAMINATOR FOR SOLAR CELL MODULE MANUFACTURE

(75) Inventors: Hidenari Nakahama, Aichi (JP); Hirotaka Iida, Aichi (JP); Hiroshi Nakano, Aichi (JP)

(73) Assignee: Nisshinbo Mechatronics Inc., Tokyo (JP)

( * ) Notice: Subject to any disclaimer, the term of this patent is extended or adjusted under 35 U.S.C. 154(b) by 0 days.

(21) Appl. No.: 13/808,233

(22) PCT Filed: Jul. 3, 2012

(86) PCT No.: PCT/JP2012/066994
§ 371 (c)(1),
(2), (4) Date: Jan. 29, 2013

(87) PCT Pub. No.: WO2013/005742
PCT Pub. Date: Jan. 10, 2013

(65) Prior Publication Data
US 2014/0120649 A1 May 1, 2014

(30) Foreign Application Priority Data
Jul. 4, 2011 (JP) .................. 2011-148318

(51) Int. Cl.
*H01L 31/048* (2014.01)
*B32B 37/10* (2006.01)
(Continued)

(52) U.S. Cl.
CPC ....... *H01L 31/0481* (2013.01); *B29C 66/81261* (2013.01); *B29C 66/8322* (2013.01); *H01L 31/048* (2013.01); *B29C 66/81264* (2013.01);
(Continued)

(58) Field of Classification Search
CPC .............. B29C 66/71; B29C 66/81455; B29C 66/0044; B29C 66/8122; B29C 35/02; B29C 63/16; Y02E 10/50; B32B 2457/12; B32B 37/1009; B32B 37/10; B32B 35/14; H01L 31/048; H01L 31/0481; B29K 2023/083; B29K 2023/16; B29K 2009/00; B29K 2809/00; C08L 23/16; C08L 23/0815; C08K 5/005; C08K 5/13; B30B 5/02
See application file for complete search history.

(56) References Cited

U.S. PATENT DOCUMENTS 4,684,687 A * 8/1987 Breach et al. .................. 524/291
5,236,992 A * 8/1993 Bush ............................. 524/495
(Continued)

FOREIGN PATENT DOCUMENTS

JP 4-165163 A 6/1992
JP 4-65556 B2 10/1992
(Continued)

OTHER PUBLICATIONS

International Search Report mailed on Jul. 31, 2012, issued in PCT/JP2012/066994.
(Continued)

*Primary Examiner* — Telly Green
*Assistant Examiner* — Sophia Nguyen
(74) *Attorney, Agent, or Firm* — Jianq Chyun IP Office

(57) ABSTRACT

The performances and durability of a diaphragm sheet of a solar cell laminator are enhanced, and a favorable lamination work is stably performed over a long period of time. In addition, by stably performing sufficient and uniform lamination over a long period of time, a high-quality module is stably manufactured over a long period of time.
A solar cell module is manufactured by using a diaphragm sheet formed of a composition containing an ethylene-propylene-diene rubber (EPDM), which is low in creep deformation and high in durability against an organic peroxide and a silane coupling agent.

1 Claim, 3 Drawing Sheets

(51) Int. Cl.
  *H01L 31/18* (2006.01)
  *B29C 65/00* (2006.01)
  *B29C 65/18* (2006.01)
  *B32B 37/00* (2006.01)

(52) U.S. Cl.
  CPC ......... *B29C 66/0044* (2013.01); *B32B 2457/12* (2013.01); *B32B 37/1009* (2013.01); *B29C 65/18* (2013.01); *B29C 66/433* (2013.01); *Y02E 10/50* (2013.01); *H01L 31/18* (2013.01); *B32B 37/003* (2013.01); *B29C 66/342* (2013.01); *B29C 66/919* (2013.01); *B29C 66/71* (2013.01); *B29C 66/81455* (2013.01)
  USPC .......................................................... 438/66

(56) References Cited

U.S. PATENT DOCUMENTS

| | | | |
|---|---|---|---|
| 5,589,026 A | 12/1996 | Perecman | |
| 6,149,757 A * | 11/2000 | Chikaki et al. | 156/286 |
| 6,635,727 B1 * | 10/2003 | Koda et al. | 526/160 |
| 6,864,315 B1 * | 3/2005 | Hakuta et al. | 525/105 |
| 6,943,220 B2 * | 9/2005 | Matsunaga et al. | 525/331.7 |
| 7,749,351 B2 * | 7/2010 | Kataoka et al. | 156/285 |
| 2002/0061979 A1 * | 5/2002 | Wolff et al. | 525/330.9 |
| 2004/0171187 A1 * | 9/2004 | Kataoka et al. | 438/64 |
| 2005/0059780 A1 * | 3/2005 | Bormuth et al. | 525/199 |
| 2006/0289119 A1 | 12/2006 | Chikaki et al. | |
| 2012/0208976 A1 * | 8/2012 | Sunaga et al. | 526/282 |
| 2012/0259053 A1 * | 10/2012 | Kamei | 524/443 |
| 2012/0321875 A1 * | 12/2012 | Nakahama et al. | 428/220 |

FOREIGN PATENT DOCUMENTS

| | | | |
|---|---|---|---|
| JP | 11-506986 A | | 6/1999 |
| JP | 2001-177119 A | | 6/1999 |
| JP | 2011199262 A | * | 10/2011 |
| WO | WO 2004/030900 A1 | | 4/2004 |
| WO | WO 2011/105623 A1 | | 9/2011 |

OTHER PUBLICATIONS

Written Opinion of the International Searching Authority mailed on Jul. 31, 2012, issued in PCT/JP2012/066994.

* cited by examiner

DIAPHRAGM SHEET, METHOD FOR MANUFACTURING SOLAR CELL MODULE USING DIAPHRAGM SHEET, AND LAMINATION METHOD USING LAMINATOR FOR SOLAR CELL MODULE MANUFACTURE

TECHNICAL FIELD

The present invention relates to a diaphragm sheet which is used for manufacturing a solar cell module, a method for manufacturing a solar cell module using a diaphragm sheet, and a lamination method of a solar cell module using a diaphragm sheet.

BACKGROUND ART

Solar cells which are generally used outdoors are used as a module sealed in some kind of a container or resin so as to avoid influences of moisture or dust, or to endure a collision of hail, a pebble, or the like or wind pressure. For example, a solar cell module which is called "superstrate structure" adopts a structure in which solar cells and an encapsulant are encapsulated between a glass plate and a back sheet. The encapsulant integrates members constituting the module with each other and shuts the solar cells off from influences of the outdoors, and it is concerned with durability of the solar cell module. As the encapsulant, those made of an ethylene vinyl acetate resin are widely used.

The solar cell module is manufactured by thermally bonding the foregoing respective members in a vacuum by a laminator. A work of this thermal bonding is performed by interposing a laminate obtained by laminating the module constituent members within the laminator between a diaphragm sheet and a hot plate, rendering a prescribed space within the laminator in a vacuum state, and heating the hot plate, thereby thermally dissolving and thermally crosslinking the encapsulant.

It is important that the thermal crosslinking of the encapsulant is achieved sufficiently and uniformly. This is because if a portion where the thermal crosslinking is insufficient is present in the encapsulant, separation of the module members from each other, invasion of moisture, and corrosion of the solar cells occur from the subject portion.

From the viewpoint of heat resistance, a silicone rubber has hitherto been widely used for the diaphragm sheet (Patent Document 1). But, the diaphragm sheet made of a silicone rubber involved such a problem that various performances are lowered due to repeated use, so that its durability is not sufficient.

Specifically, in the case of repeatedly using the diaphragm sheet, there were involved such problems that wrinkles are generated in the diaphragm sheet, thereby making it impossible to achieve uniform pressing during the lamination processing; and that the diaphragm sheet is abruptly broken during the lamination processing, thereby causing a production loss due to a replacement work of the diaphragm sheet and a lowering of the manufacturing yield.

PRIOR ART DOCUMENT

Patent Document

[Patent Document 1] JP-B-4-65556

SUMMARY OF THE INVENTION

Problem to be Solved by the Invention

A first object of the present invention is to provide a lamination method of a solar cell module capable of enhancing durability of a solar cell module, realizing long-term and stable operations of a laminator, and enhancing production efficiency. In addition, a second object thereof is to provide a diaphragm sheet for realizing the first object.

Means for Solving the Problem

In order to solve the foregoing problem, the present inventor made extensive and intensive investigations. As a result, it has been found that a cause why the diaphragm sheet is poor in durability resides in the matter that an organic peroxide and a silane coupling agent contained in an encapsulant together with an ethylene vinyl acetate resin are gasified at the time of thermal crosslinking and released outside, and the diaphragm sheet is chemically eroded step by step by the subject gas, leading to resolution of this.

(A) The diaphragm sheet according to the present invention for solving the foregoing problem is
a diaphragm sheet to be used in a laminator for solar cell module manufacture using an ethylene vinyl acetate resin as an encapsulant, which comprises a composition containing an ethylene-propylene-diene rubber and which satisfies the following requirements (1) and (2):
(1) swelling ratios with respect to an organic peroxide and a silane coupling agent contained in the encapsulant are not more than 20%; and
(2) a creep deformation of the diaphragm sheet at a hot plate temperature of 130° C. is not more than 3 mm.

(B) In addition, the method for manufacturing a solar cell module according to the present invention is
a method for manufacturing a solar cell module using an ethylene vinyl acetate resin as an encapsulant, which comprises
a step of laminating solar cells with the encapsulant by a laminator using a diaphragm sheet,
the diaphragm sheet comprising a composition containing an ethylene-propylene-diene rubber and satisfying the following requirements (1) and (2):
(1) swelling ratios with respect to an organic peroxide and a silane coupling agent contained in the encapsulant are not more than 20%; and
(2) a creep deformation of the diaphragm sheet at a hot plate temperature of 130° C. is not more than 3 mm.

(C) In addition, the lamination method according to the present invention is
a lamination method using a laminator for solar cell module manufacture, wherein
a diaphragm sheet of the laminator is the diaphragm sheet as set forth in (A); and
in a vacuum evacuation step at the time of lamination processing, a time required until a degree of vacuum within a lower chamber of the laminator reaches 133 Pa is not more than 100 seconds, and a degree of vacuum within the lower chamber at the time when 3 minutes elapsed after the degree of vacuum has reached 133 Pa is not more than 100 Pa.

The ethylene vinyl acetate resin is hereinafter sometimes referred to as "EVA", and the ethylene-propylene-diene rubber is hereinafter sometimes referred to as "EPDM".

Effects of the Invention

In the diaphragm sheet according to the present invention, in view of the fact that the creep deformation is low, the time required until the degree of vacuum within the chamber of the laminator at the time of lamination processing reaches a prescribed degree of vacuum can be shortened, and the production efficiency of a solar cell module can be increased.

In addition, in the diaphragm sheet according to the present invention, in view of its low creep deformation, sufficient and uniform pressing at the time of lamination can be achieved. Accordingly, a degree of crosslinking of the encapsulant of the manufactured solar cell module to be manufactured can be made sufficient and uniform, and it becomes possible to stably produce a solar cell module having high quality and long life.

In addition, in the diaphragm sheet according to the present invention, in view of its low creep deformation and low swelling ratio with respect to the organic peroxide and the silane coupling agent contained in the encapsulant, the durability of the diaphragm sheet can be tremendously enhanced, and the production efficiency can be tremendously enhanced.

In addition, in the method for manufacturing a solar cell module according to the present invention and the lamination method using a laminator for solar cell module manufacture according to the present invention, a solar cell module having high quality and long life can be produced stably and efficiently.

MODES FOR CARRYING OUT THE INVENTION

Modes of the present invention are hereunder described in detail.

Figure 1:
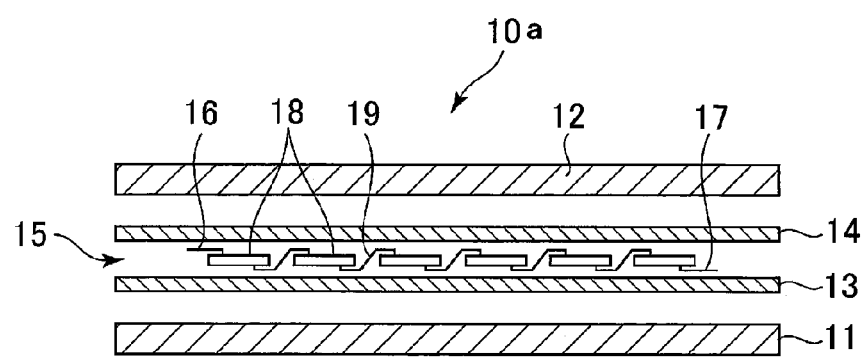
FIG. 1 is a cross-sectional view showing an example of a configuration of a solar cell module.

<1> Solar Cell Module:

First of all, an example of a solar cell module which is manufactured using a diaphragm sheet according to the present invention is explained by reference to FIG. 1. FIG. 1 is a cross-sectional view showing an example of a configuration of a solar cell module using solar cells of a crystal system.

As illustrated, the solar cell module has a configuration in which a matrix 15 is interposed between a transparent cover glass 11 and a back surface material 12 via encapsulants 13 and 14. The back surface material 12 is also called a back sheet, and a polyethylene resin film, a polyester resin film, a fluorine resin film, or the like is useful. For the encapsulants 13 and 14, a resin sheet formed of a composition containing an ethylene vinyl acetate resin (EVA), an organic peroxide, a silane coupling agent, and the like, or the like is used. The matrix 15 has a configuration in which solar cells 18 of a crystal system are connected to each other via lead wires 19 between electrodes 16 and 17.

Such a solar cell module can be manufactured by laminating a laminate in which a cover glass, an EVA sheet, solar cells, an EVA sheet, and a back surface material are laminated in this order, by using a laminator as described later.

Incidentally, the diaphragm sheet according to the present invention can be used for the manufacture of not only a solar cell module using solar cells of a crystal system but a solar cell module using solar cells of a thin film system (amorphous system).

<2> Laminator for Solar Cell Module Manufacture:

Next, an example of a laminator which is used at the time of manufacturing a solar cell module using the diaphragm sheet according to the present invention is explained by reference to FIGS. 2 to 4.

Figure 2:
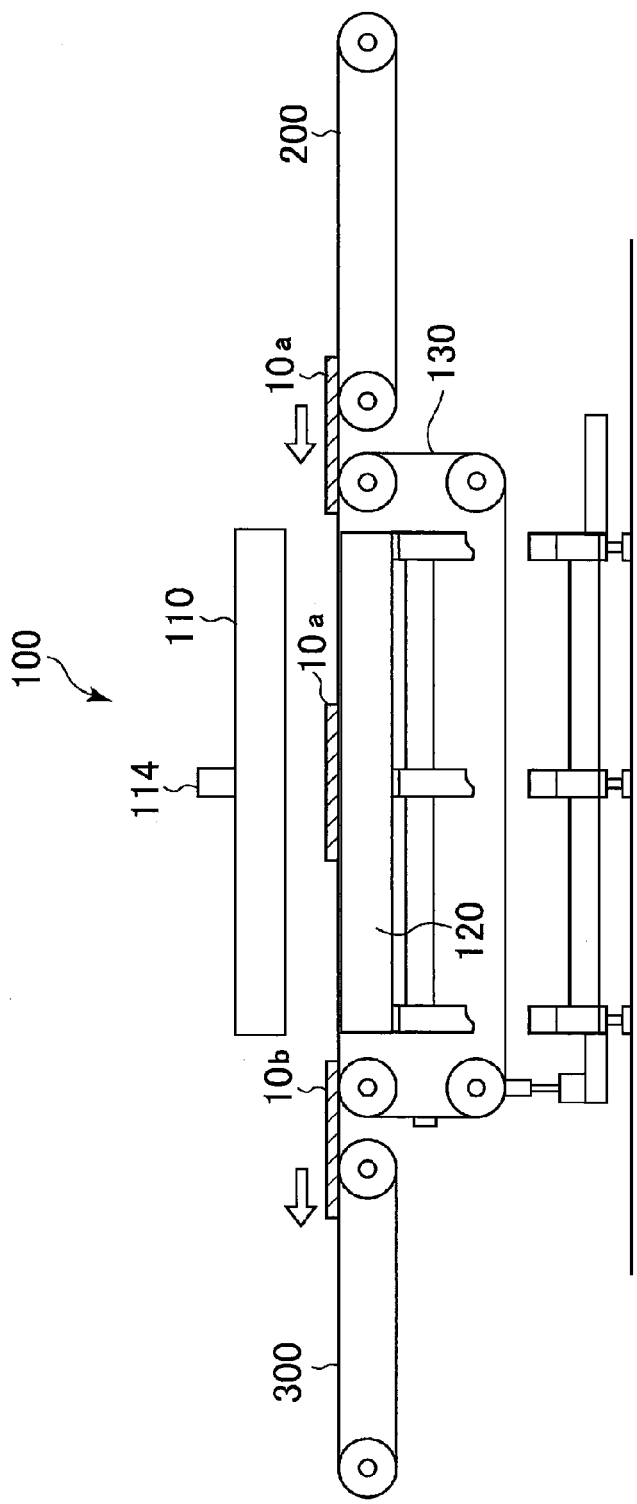
FIG. 2 is a view showing an example of a configuration of the whole of a laminator for solar cell module manufacture.

FIG. 2 is a view showing an example of a configuration of the whole of a laminator 100. FIGS. 3 and 4 are each a side cross-sectional view showing an example of a lamination part 101 for laminating a material 10a to be processed (a laminate composed of a cover glass, an EVA sheet, solar cells, an EVA sheet, and a back surface material) in a laminator 100 according to the present embodiment. FIG. 3 shows a state before the lamination processing, and FIG. 4 shows a state during the lamination processing.

In an upper case 110, a space opened in the downward direction is formed, and a diaphragm sheet 112 is provided in such a manner that it comes into contact with this opened surface. A space (upper chamber 113) partitioned by the diaphragm sheet 112 is formed within the upper case 110. As described later, the diaphragm sheet 112 functions as a pressing member for pressing the material 10a to be processed and is able to laminate the material 10a to be process.

In addition, on the upper surface of the upper case 110 is provided an air inlet and outlet port 114 communicating with the upper chamber 113. It is possible to subject the upper chamber 113 to vacuum evacuation, thereby rendering it in a vacuum state or to introduce atmospheric pressure into the upper chamber 113 via the air inlet and outlet port 114.

In a lower case 120, a space (lower chamber 121) opened in the upward direction is formed, and a hot plate 122 (panel-shaped heater) is provided in this space. The hot plate 122 is supported by a support member vertically arranged on the bottom of the lower case 120 so as to keep the horizontal state. In that case, the hot plate 122 is supported in such a manner that its surface has substantially the same height as the opened surface of the lower chamber 121.

In addition, on the lower surface of the lower case 120 is provided an air inlet and outlet port 123 communicating with the lower chamber 121. It is possible to subject the lower chamber 121 to vacuum evacuation, thereby rendering it in a vacuum state or to introduce atmospheric pressure into the lower chamber 121 via the air inlet and outlet port 123.

Between the upper case 110 and the lower case 120 is provided a conveyor belt 130 in a freely movable state in an upper portion of the hot plate 122. The conveyor belt 130 receives the material 10a to be processed from a carry-in conveyor 200 shown in FIG. 2 and conveys it into a central position of the lamination part 101 or delivers a material to be processed after the lamination (solar cell module 10b) into a carry-out conveyor 300 shown in FIG. 2.

In addition, between the upper case 110 and the lower case 120 is provided a release sheet 140 in an upper portion of the conveyor belt 130. When the encapsulants 13 and 14 of the material 10a to be processed is melted (see FIG. 1), the release sheet 140 prevents the adhesion of the encapsulants 13 and 14 to the diaphragm sheet 112 from occurring. As the release sheet 140, a resin film, the surface of which is treated with a silicone release agent, and the like can be used.

<3> Outline of Lamination Processing Method:

Next, an embodiment of the lamination step using the diaphragm sheet according to the present invention is more specifically explained.

Figure 3:
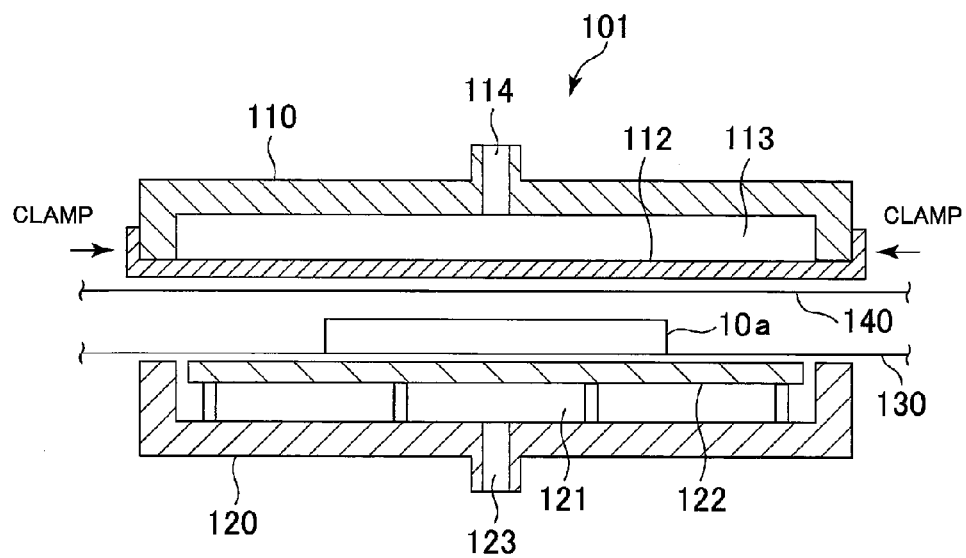
FIG. 3 is a side cross-sectional view showing an example of a lamination part of a laminator for solar cell module manufacture.

First of all, as shown in FIG. 3, the material 10a to be processed is conveyed into a central position of the lamination part 101 by the conveyor belt 130. In addition, the hot plate 122 is subjected to temperature control by a temperature controller in such a manner that its temperature reaches a targeted temperature. The temperature at the time of lamination is usually from 140 to 170° C.

Subsequently, the upper chamber 113 is subjected to vacuum evacuation via the air inlet and outlet port 114 of the upper case 110. In addition, the upper case 110 is descended by an ascending and descending apparatus (not illustrated). By descending the upper case 110, it is possible to bring the upper case 110 and the lower case 120 into close contact with each other via the diaphragm sheet, thereby keeping each of the upper chamber 113 and the lower chamber 121 in a hermetically sealed state. Incidentally, in this state, the majority of the diaphragm sheet exclusive of the surroundings thereof is in a state of adhering to the upper chamber.

Subsequently, the lower chamber 121 is subjected to vacuum evacuation via the air inlet and outlet port 123 of the lower case 120. By the vacuum evacuation of the lower chamber 121, bubbles contained in the material 10a to be processed can be removed. Furthermore, in this state, the material 10a to be processed is heated by the hot plate 122, whereby the encapsulants 13 and 14 contained therein are melted.

Subsequently, atmospheric pressure is introduced into the upper chamber 113 via the air inlet and outlet port 114 of the upper case 110 while keeping the vacuum state of the lower chamber 121. According to this, a pressure difference is generated between the upper chamber 113 and the lower chamber 121, the diaphragm sheet 112 is expanded, and as shown in FIG. 4, the diaphragm sheet 112 is extruded downward. The material 10a to be processed is pressed by the downwardly extruded diaphragm sheet 112, and the respective constituent members are laminated by the melted encapsulants 13 and 14.

After completion of the lamination step in this way, atmospheric pressure is introduced into the lower chamber 121 via the air inlet and outlet port 123 of the lower case 120. In addition, the upper case 110 is ascended by an ascending and descending apparatus (not illustrated). As shown in FIG. 2, by ascending the upper case 110, the conveyor belt 130 can be moved. The conveyor belt 130 delivers the material to be processed after the lamination (solar cell module 10b) into the carry-out conveyor 300.

Figure 4:
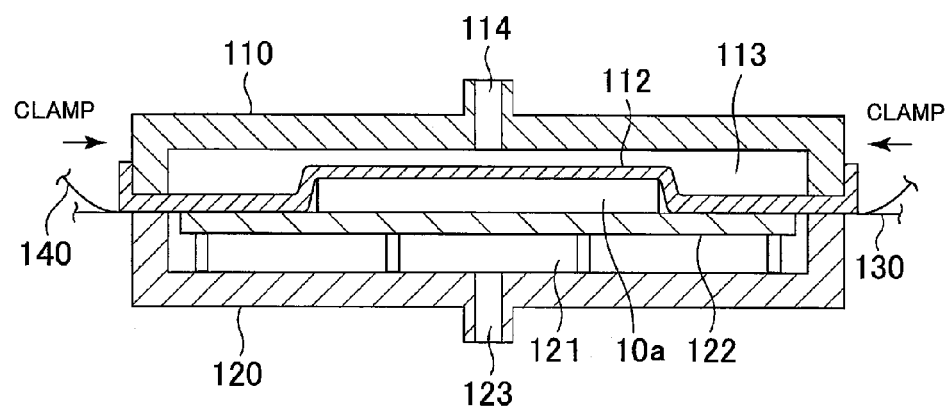
FIG. 4 is a side cross-sectional view showing an example of a lamination part at the time of lamination processing of a laminator for solar cell module manufacture.

In addition, in the lamination step, since the adhesion of each of the members is increased by pressing the members of the solar cell module by the diaphragm sheet, it is preferable that the lower chamber 121 shown in FIG. 4 is able to realize a high degree of vacuum.

Furthermore, in view of productivity, in the lamination step, it is desirable that a time required until the degree of vacuum reaches a fixed value or less is short; and that the degree of vacuum is kept for a fixed period of time. Specifically, from the viewpoint of preventing retention of bubbles within the module to be caused due to solidification of the encapsulant from occurring, in the vacuum evacuation step at the time of lamination, the time required until the degree of vacuum within the lower chamber of the laminator reaches 133 Pa is preferably not more than 120 seconds, more preferably not more than 100 seconds, and still more preferably not more than 90 seconds. In addition, from the viewpoint of keeping a sufficient degree of vacuum until completion of the step to prevent incorporation of bubbles into the module from occurring, in the vacuum evacuation step at the time of lamination, a degree of vacuum within the lower chamber at the time when 3 minutes elapsed after the degree of vacuum within the lower chamber of the laminator has reached 133 Pa is controlled to preferably not more than 100 Pa, more preferably not more than 80 Pa, and still more preferably not more than 70 Pa.

The diaphragm sheet according to the present invention as described later is able to realize the foregoing requirements. Incidentally, the silicone rubber which has hitherto been used for diaphragm sheets may be impossible to realize the foregoing requirements because its bond angle of molecule is larger than that of EPDM, and its gas permeability is high.

Incidentally, the foregoing degree of vacuum can be measured by the method described in the Examples.

<4> Encapsulant:

The encapsulant is a material composed mainly of an ethylene vinyl acetate resin (EVA) and containing, as additives, an organic peroxide, a silane coupling agent, and the like. The encapsulant can be obtained by molding an encapsulant composition containing EVA and additives into a sheet.

The ethylene vinyl acetate resin (EVA) is a resin obtained by copolymerizing ethylene and vinyl acetate. In general, a content of the vinyl acetate component is from 3 to 40% by mole.

Proportions of EVA, the organic peroxide, and the silane coupling agent in the total weight components of the encapsulant are from 92 to 98% by weight for EVA, from 1 to 5% by weight for the organic peroxide, and from about 1 to 3% by weight for the silane coupling agent, respectively.

<5> Diaphragm Sheet:

The present inventor has found that in the case of using an ethylene-propylene-diene rubber (EPDM) as the diaphragm sheet, the durability against a gas generated at the time of thermal crosslinking of the EVA resin is enhanced. Furthermore, the present inventor has found that it is useful that the diaphragm sheet composed of EPDM satisfies the following requirements (1) and (2):

(1) a swelling ratio with respect to a crosslinking agent contained in the ethylene vinyl acetate resin is not more than 20%, and a swelling ratio with respect to the silane coupling agent is not more than 20%; and (2) a creep deformation of the diaphragm sheet at a hot plate temperature of 130° C. is not more than 3 mm.

From the viewpoints of mechanical strength of the solar cell module and adhesion to the cover glass, the encapsulant contains, in addition to EVA, an organic peroxide and a silane coupling agent. Such organic peroxide and silane coupling agent are gasified at the time of thermal lamination in fabricating a solar cell module and released outside. When the diaphragm sheet absorbs the organic peroxide and the silane coupling agent contained in the foregoing gas, physical properties and chemical properties of the diaphragm sheet change step by step, whereby the initial performances are not maintained. Accordingly, it is required that the diaphragm sheet has resistance to the organic peroxide and the silane coupling agent, specifically, it is hardly swollen by the organic peroxide and the silane coupling agent.

Incidentally, the silicone rubber which has hitherto been used for diaphragm sheets is very liable to absorb the organic peroxide and the silane coupling from the standpoint of its molecular structure.

The organic peroxide functions as a crosslinking agent of EVA, and examples thereof include a diacyl peroxide, an alkyl peroxy ester, a peroxy dicarbonate, a peroxy carbonate, a dialkyl peroxide, a hydroperoxide, a ketone peroxide, and the like. It is required that the diaphragm sheet according to the present invention has a swelling ratio with respect to the organic peroxide contained in the encapsulant is not more than 20%. The subject swelling ratio is preferably not more than 10%, and more preferably not more than 5%. In particular, it is preferable that the diaphragm sheet according to the present invention satisfies the foregoing requirement regarding the swelling ratio with respect to a peroxy carbonate based organic peroxide.

Examples of the peroxy carbonate based organic peroxide include tertiary-butyl peroxy-2-ethylhexyl carbonate, tertiary-amyl peroxy-2-ethylhexyl carbonate, and the like.

The silane coupling agent has a function to enhance adhesion to the cover glass, and examples thereof include vinyl based, epoxy based, styryl based, methacrylic based, acrylic based, amino based, ureide based, mercapto based, sulfide based, and isocyanate based compounds, and the like. It is required that the diaphragm sheet according to the present invention has a swelling ratio with respect to the silane coupling agent contained in the sheet of not more than 20%. The subject swelling ratio is preferably not more than 10%, and more preferably not more than 5%. In particular, it is preferable that the diaphragm sheet according to the present invention satisfies the foregoing requirement regarding the swelling ratio to a vinyl based silane coupling agent.

Examples of the vinyl based silane coupling agent include vinyl trimethoxysilane, vinyl triethoxysilane, and the like.

The swelling ratios of the diaphragm sheet with respect to the organic peroxide and the silane coupling agent can be measured by the method described in the Examples.

In addition, in order that the diaphragm sheet according to the present invention may be suitably used as a laminator for solar cell manufacture, it is required that a creep deformation thereof is not more than 3 mm. Here, the creep deformation refers to an index showing a degree of deformation at the time of lamination of the diaphragm sheet and can be measured by the method described in the Examples.

When the creep deformation of the diaphragm sheet is more than 3 mm, it may be impossible to perform uniform press of the solar cell module (constituent member), which is a function of the diaphragm sheet, at the time of continuous lamination processing. In addition, when the creep deformation of the diaphragm sheet is more than 3 mm, wrinkles to be caused due to the mark retention generate a crack by continuous processing, resulting in a lowering of the durability. In consequence, it is important to control the creep deformation to not more than 3 mm.

Incidentally, in order to realize the matter of "to uniformly press the solar cell module", which is a function of the diaphragm sheet, the creep deformation is preferably not more than 2 mm, and more preferably not more than 1 mm.

The diaphragm sheet can be formed of an EPDM composition containing EPDM and an additive to be added as the need arises.

EPDM is one obtained by introducing a small amount of a third component that is a non-conjugated diene monomer into an ethylene-propylene rubber (EPM) that is a copolymer of ethylene and propylene, thereby bringing a double bond in a side chain thereof. Examples of the third component include ethylidene norbornene, 1,4-hexadiene, dicyclopentadiene, and the like, with ethylidene norbornene being suitable. A proportion of the third component in EPDM is usually not more than 20% by weight.

Examples of the additive of EPDM include a reinforcing material such as silica, carbon black, etc., a softening agent such as an aromatic process oil, a naphthene based process oil, a paraffin based process oil, etc., a crosslinking agent, a co-crosslinking agent, an antioxidant, a processing aid, and the like.

In addition, it is preferable to use an organic peroxide as the crosslinking agent, and examples thereof include a diacyl peroxide, an alkyl peroxide, a peroxy dicarbonate, a peroxy carbonate, a peroxy ketal, a dialkyl peroxide, a hydroperoxide, a ketone peroxide, and the like. Above all, an organic peroxide having a one-minute half-life temperature of 158° C. or higher, and specifically, examples thereof include dicumyl peroxide, 2,5-dimethyl-2,5-di(tertiary butyl peroxy) hexane, and the like.

Furthermore, from the viewpoint of increasing the crosslinking efficiency, a co-crosslinking agent may be used together with the crosslinking agent. Examples of the co-crosslinking agent include triallyl isocyanurate (TAIC), ethylene glycol dimethacrylate (EG), trimethylolpropane trimethacrylate (TMP), and the like.

From the viewpoints of making the creep deformation and the swelling ratio low, addition amounts of the respective additives based on 100 parts by weight of EPDM are preferably from 70 to 150 parts by weight, and more preferably from 90 to 110 parts by weight for the reinforcing material; preferably from 50 to 150 parts by weight, and more preferably 70 to 120 parts by weight for the softening agent; preferably from 1 to 15 parts by weight, and more preferably from 2 to 12 parts by weight for the crosslinking agent; and preferably from 0 to 10 parts by weight, and more preferably from 1 to 8 parts by weight for the co-crosslinking agent, respectively.

The diaphragm sheet can be, for example, manufactured by molding a compound having the EPDM composition (exclusive of the crosslinking agent and the co-crosslinking agent) mixed therein and then adding the crosslinking agent (further adding the co-crosslinking agent as the need arises) to the compound, followed by forming the mixture into a sheet.

In general, when the crosslinking agent is added to the compound, followed by molding this into a sheet, molding processing is performed at a temperature of about 160° C. However, a long time was required for crosslinking EPDM at this temperature. In the case of making the crosslinking time short, the crosslinking agent remains in the diaphragm sheet, and EPDM is crosslinked at the time of manufacturing a solar cell module. As a result, it is difficult to control the creep deformation to not more than 3 mm.

Accordingly, from the viewpoint of the creep deformation, the molding temperature of the diaphragm sheet is controlled to preferably 170° C. or higher, and more preferably 180° C. or higher. In addition, on that occasion, the molding time is controlled to preferably 5 minutes or more, and more preferably from 10 to 50 minutes.

Incidentally, the molding temperature of the diaphragm sheet controlled to 170° C. or higher, or the molding time controlled to 5 minutes or more is also suitable from the viewpoint of allowing the swelling ratios of the diaphragm sheet with respect to the organic peroxide and the silane coupling agent contained in the encapsulant to fall within the foregoing range.

In addition, in the case of using an organic peroxide as the crosslinking agent, from the viewpoint of preventing the matter that the organic peroxide remains in the diaphragm sheet from occurring, it is preferable to include a thermal treatment step to an extent that the organic peroxide is thoroughly decomposed at the time of molding or after molding a diaphragm sheet. Since the organic peroxide is substantially decomposed in a time of from 6 to 7 times a half-life, for example, it is preferable to include a step of heating at a temperature of a one-minute half-life temperature or higher for 6 minutes or more at the time of molding or after molding a diaphragm sheet.

EXAMPLES

The diaphragm sheet and the lamination method of a solar cell module using the subject diaphragm sheet according to the present invention are explained with reference to the Examples and Comparative Examples. The explanation is made while being divided into (1) fabrication of compound for diaphragm sheet, (2) sheet molding, (3) measurement of physical properties of sheet, and (4) practical test of laminator for solar cell manufacture.

(1) Fabrication of Compound for Diaphragm Sheet:

A composition of each of compounds of Examples 1 and 2 and Comparative Example 1 is shown in Table 1. The compound fabrication was performed by kneading components shown in Table 1 exclusive of a crosslinking agent using a kneader (ESTR75-150-180, manufactured by Suzuka Engineering Co., Ltd.) for 15 minutes.

(3-1-2) Silane Coupling Agent:

A swelling ratio with respect to a silane coupling agent was measured in the same manner as that in (3-1-1), except that the liquid for dipping was changed to a silane coupling agent (vinyl triethoxysilane, a trade name: KBE-1003, manufactured by Shin-Etsu Chemical Co., Ltd.).

(3-2) Creep Deformation:

On a flat pedestal of a solar cell module laminator provided with a flat pedestal having an effective area of hot plate of 50 cm×50 cm, a glass plate 20 cm long, 20 cm wide, and 2 cm thick was placed, and a diaphragm sheet 75 cm long, 75 cm wide, and 3 mm thick was further set thereon. When the diaphragm sheet was pressed against the glass plate for 48

TABLE 1

| | | | Example 1 | Example 2 | Comparative Example 1 | Comparative Example 2 | Comparative Example 3 |
|---|---|---|---|---|---|---|---|
| Compound composition | Polymer | EPDM EPT4045, manufactured by Mitsui Chemicals, Inc. | 100 | 100 | 100 | — | 100 |
| | | Silicone rubber KE-555U, manufactured by Shin-Etsu Silicone Co., Ltd. | — | — | — | 100 | — |
| | Reinforcing material | Carbon black | 100 | 80 | 80 | — | 60 |
| | | Silica | — | — | — | 50 | — |
| | Softening agent | Paraffin oil | 100 | 60 | 60 | — | 20 |
| | | Silicone oil | — | — | — | 3 | — |
| | Processing aid | Zinc while No. 1 | 5 | 5 | 5 | — | 5 |
| | | Stearic acid | 1 | 1 | 1 | — | 1 |
| | | Zinc stearate | — | — | — | 1 | — |
| | Antioxidant | Irganox 1078, manufactured by Clariant | 2 | 2 | 2 | — | — |
| | | Blending part number | 308 | 246 | 246 | 154 | 186 |
| Crosslinking agent | | Percumyl D40C (*1), manufactured by NOF Corporation | 7 | 7 | 7 | — | 6 |
| | | C-8 (*2), manufactured by Shin-Etsu Chemical Co., Ltd. | — | — | — | 7 | — |
| Co-crosslinking agent | | TAIC (*3), manufactured by Nippon Kasei Chemical Co., Ltd. | 3 | — | — | — | 3 |
| | | Molding temperature (° C.) | 180 | 180 | 160 | 165 | 160 |

(*1): Mixture containing 40% by mass of dicumyl peroxide and 60% by mass of an inert filler
(*2): Composition containing 25% by mass of 2,5-dimethyl-2,5di(tertiary butyl peroxy)hexane
(*3): 100% by mass of triallyl isocyanurate (2) Sheet Molding:

After the temperature of the compound reached not higher than 80° C., the crosslinking agent shown in Table 1 was added, and a diaphragm sheet 75 cm long, 75 cm wide, and 3 mm thick was molded using a press molding machine (manufactured by Ka nsai Roll Co., Ltd.). The molding temperature of each of the Examples and Comparative Examples is shown in Table 1, and the molding temperature of each of Examples 1 and 2 was set to 180° C., and the molding temperature of Comparative Example 1 was set to 160° C. The molding time was 15 minutes in each of the Examples and 30 minutes in each of the Comparative Examples.

(3) Measurement of Physical Properties of Sheet:
(3-1) Measurement of Swelling Ratio:
(3-1-1) Organic Peroxide:

1 g of a fragment of a diaphragm sheet molded article was dipped in 30 mL of an organic peroxide (tertiary-butyl peroxy-2-ethylhexyl carbonate, a trade name: Luperox TBEC, manufactured by Arkema Yoshitomi, Ltd.) at a liquid temperature of 25° C. for 70 hours. Thereafter, the diaphragm sheet was taken out, and the liquid attached on the surface was wiped off with a trade name, "Kimwipe", manufactured by Nippon Paper Crecia Co., Ltd. After allowing the diaphragm sheet to stand at 25° C. for one hour, its weight was measured up to a unit of 0.0001 g by an electronic balance. A swelling ratio with respect to the organic peroxide was calculated in accordance with the following equation.

Swelling ratio (%)=[{(Weight after dipping)−(Weight before dipping)}/(Weight before dipping)]×100 hours under a condition in which an upper chamber was made at atmospheric pressure, a degree of vacuum of a lower chamber was not more than 70 Pa, and a hot plate temperature was 130° C., a difference in recesses and projections generated in a contact area of the diaphragm sheet with the glass plate was defined as the creep deformation. Incidentally, a trade name, Lam 0505S, manufactured by Nisshinbo Mechatronics Inc., or the like can be used as the solar cell module laminator.

(3-3) Degree of Vacuum:

The degree of vacuum was measured in the following manner. Namely, a diaphragm sheet 200 cm long, 420 cm wide, and 3 mm thick was set in a solar cell module laminator (Lam 1537, manufactured by Nisshinbo Mechatronics Inc.); a solar cell module was laminated at a set temperature of hot plate of 150° C.; a time until the degree of vacuum within a lower chamber reached 133 Pa and a degree of vacuum within the lower chamber at the time when 3 minutes elapsed after the lamination was performed at the subject degree of vacuum, were measured. Incidentally, a capacity of each of the upper chamber and the lower chamber was $1.34 \times 10^8$ $mm^3$, and a force of vacuum evacuation was set to 340 $m^3$/h.

(4) Practical Test by Solar Cell Laminator:
(4-1) Crosslinking Ratio of EVA Sheet (Xylene Method):

Each of the diaphragm sheets of the Examples and Comparative Examples was set in a laminator for solar cell module (Lam 1537, manufactured by Nisshinbo Mechatronics Inc.), an EVA sheet (Ultra Pearl, manufactured by Sanvic Inc.) was used as an encapsulant, and a solar cell module manufacture work was performed while adopting procedures at a processing temperature of 170° C. and a lamination time of 20 minutes as one cycle. This module manufacture work was continuously performed five times, and a ratio of crosslinking of EVA in the module at the fifth lamination was measured by the following method.

In a lidded glass bottle, 1 g of a fragment of the lamination-processed EVA and 100 g of xylene were charged and thermally treated at 110° C. for 12 hours. Thereafter, filtration with a filter paper (JIS P3801, Grade: No. 5A) was performed, and a filtration residue was dried at 110° C. for 8 hours. Thereafter, a weight of the residue was measured, and the ratio of crosslinking was calculated in accordance with the following equation.

Ratio of crosslinking=[(Weight of residue)/(Weight of EVA (1 g))]×100

Similarly, the module manufacture work was performed 500 times, and a ratio of crosslinking of EVA in the module at the 500-th lamination was measured.

(4-2) Durability of Diaphragm Sheet:

Each of the diaphragm sheets of the Examples and Comparative Examples was set in a solar cell module laminator (Lam 1537, manufactured by Nisshinbo Mechatronics Inc.), an EVA sheet (Ultra Pearl, manufactured by Sanvic Inc.) was used as an encapsulant, and a solar cell module manufacture work was performed while adopting procedures at a processing temperature of 150° C. and a lamination time of 20 minutes as one cycle. This module manufacture work was repeated, and a number of times until the generation of a crack, when the module was pressed, in the diaphragm sheet positioned in the neighborhood of the module (a portion where the amount of a gas generated from EVA was considered to be the largest) was examined.

Results of (3) and (4) are shown in Table 2.

TABLE 2

|  |  | Example 1 | Example 2 | Comparative Example 1 | Comparative Example 2 | Comparative Example 3 |
| --- | --- | --- | --- | --- | --- | --- |
|  | Polymer | EPDM | EPDM | EPDM | Silicone | EPDM |
|  | Molding temperature (° C.) | 180 | 180 | 160 | 165 | 160 |
| Swelling ratio (%) | Organic peroxide | 3.0 | 8.0 | 8.2 | 57.5 | 11.2 |
|  | Silane coupling agent | 2.0 | 4.0 | 5.1 | 170.7 | 8.2 |
|  | Creep deformation (mm) | 0.3 | 3.0 | 16.0 | 1.2 | 20.0 |
| Degree of vacuum | Time up to 133 Pa (sec) | 81 | 90 | 95 | 120 | 100 |
|  | Degree of vacuum after an elapse of 3 minutes (Pa) | 70 | 90 | 91 | 110 | 93 |
| Ratio of crosslinking of EVA (%) | Pressing of 50 times at 170° C. for 20 minutes | 90 | 85 | 83 | 84 | 85 |
|  | Pressing of 500 times at 170° C. for 20 minutes | 90 | 84 | 60 | 47 | 53 |
|  | Durability (number of times) | 7000 | 7800 | 2500 | 900 | 1500 |

As shown in Table 2, by using the EPDM-made diaphragm sheet having a creep deformation of not more than 3 mm and a swelling ratios with respect to the organic peroxide and the silane coupling agent contained in the EVA sheet of not more than 20%, since not only the ratio of crosslinking of EVA could be increased, but the durability of the diaphragm sheet could be enhanced, the number of times until the generation of a crack at the time of repeatedly using the diaphragm sheet could be greatly increased. In addition, according to the condition of the Examples, in the vacuum evacuation step at the time of lamination processing, the time until the degree of vacuum within the lower chamber of the laminator reached 133 Pa could be decreased to not more than 100 seconds, and the degree of vacuum within the lower chamber at the time when 3 minutes elapsed after the degree of vacuum has reached 133 Pa could be decreased to not more than 100 Pa.

In addition, by using the EPDM-made diaphragm sheet having a creep deformation of not more than 3 mm and a swelling ratio with respect to the organic peroxide of not more than 20% and a swelling ratio with respect to the silane coupling agent of not more than 20%, it is noted that not only the manufacture efficiency of the solar cell module can be increased, but the stable manufacture thereof can be achieved over a long period of time.

EXPLANATIONS OF LETTERS OR NUMERALS

10a: Material to be processed
10b: Solar cell module
11: Cover glass
12: Back surface material
13, 14: Encapsulant
100: Laminator
101: Lamination part
110: Upper case
112: Diaphragm sheet
113: Upper chamber
120 Lower case
121: Lower chamber
122: Hot plate

The invention claimed is:

1. A lamination method using a laminator for solar cell module manufacture using an ethylene vinyl acetate resin as an encapsulant, wherein
a diaphragm sheet of the laminator comprises a composition containing an ethylene-propylene-diene rubber and satisfies the following requirements (1) and (2):
(1) swelling ratios with respect to an organic peroxide and a silane coupling agent contained in the encapsulant is not more than 20%, and
(2) a creep deformation of the diaphragm sheet at a hot plate temperature of 130° C. is not more than 3 mm; and
in a vacuum evacuation step at the time of lamination processing, a time required until a degree of vacuum within a lower chamber of the laminator reaches 133 Pa is not more than 100 seconds, and a degree of vacuum within the lower chamber at the time when 3 minutes elapsed after the degree of vacuum has reached 133 Pa is not more than 100 Pa.

* * * * *